(12) United States Patent
Watanabe et al.

(10) Patent No.: US 9,982,126 B2
(45) Date of Patent: May 29, 2018

(54) RESIN COMPOSITION FOR SEALING ELECTRICAL ELECTRONIC PARTS, METHOD OF PRODUCING ELECTRICAL ELECTRONIC PARTS, AND SEALED ELECTRICAL ELECTRONIC PARTS

(71) Applicant: TOYOBO CO., LTD., Osaka (JP)

(72) Inventors: Yosuke Watanabe, Shiga (JP); Kenji Shiga, Shiga (JP)

(73) Assignee: TOYOBO CO., LTD., Osaka (JP)

( * ) Notice: Subject to any disclaimer, the term of this patent is extended or adjusted under 35 U.S.C. 154(b) by 493 days.

(21) Appl. No.: 14/424,146

(22) PCT Filed: Aug. 20, 2013

(86) PCT No.: PCT/JP2013/072166
§ 371 (c)(1),
(2) Date: Feb. 26, 2015

(87) PCT Pub. No.: WO2014/034474
PCT Pub. Date: Mar. 6, 2014

(65) Prior Publication Data
US 2015/0322258 A1 Nov. 12, 2015

(30) Foreign Application Priority Data

Aug. 29, 2012 (JP) .................. 2012-189009
Aug. 29, 2012 (JP) .................. 2012-189010

(51) Int. Cl.
*C08L 63/00* (2006.01)
*C08L 67/02* (2006.01)
(Continued)

(52) U.S. Cl.
CPC ...... *C08L 67/025* (2013.01); *B29C 45/14008* (2013.01); *C08L 23/00* (2013.01);
(Continued)

(58) Field of Classification Search
CPC .. B29C 45/14008; C08L 67/04; C08L 67/025; C08L 23/00; C08L 63/00;
(Continued)

(56) References Cited

U.S. PATENT DOCUMENTS

2003/0065070 A1 4/2003 Nishida et al.
2003/0216484 A1 11/2003 Phillips et al.
(Continued)

FOREIGN PATENT DOCUMENTS

CN 1509314 6/2004
JP 60-18562 1/1985
(Continued)

OTHER PUBLICATIONS

Yuichi Matsuno et. al. English Translation of JP2010-150392. Jul. 8, 2010.*
(Continued)

*Primary Examiner* — David T Karst
(74) *Attorney, Agent, or Firm* — Wenderoth, Lind & Ponack, L.L.P.

(57) ABSTRACT

Provided is a sealant for electrical and electronic parts having excellent fire resistance and adhesiveness, and provided are a method for manufacturing a sealant for electrical and electronic parts suitable therefor and a resin composition for sealing electrical and electronic parts. A resin composition for sealing electrical and electronic parts containing: a polyester (A) obtained by copolymerizing a polyalkylene glycol component and/or a polylactone component; an epoxy resin (B); a polyolefin resin (C); and a phosphoric acid ester (D).

13 Claims, 1 Drawing Sheet

(51) Int. Cl.
 *B29C 45/14* (2006.01)
 *H01L 23/31* (2006.01)
 *C08L 67/04* (2006.01)
 *H01L 23/29* (2006.01)
 *C08L 23/00* (2006.01)
 *B29K 23/00* (2006.01)
 *B29K 63/00* (2006.01)
 *B29K 67/00* (2006.01)
 *B29L 31/34* (2006.01)
 *C08K 5/521* (2006.01)

(52) U.S. Cl.
 CPC .............. *C08L 63/00* (2013.01); *C08L 67/04* (2013.01); *H01L 23/293* (2013.01); *H01L 23/3107* (2013.01); *B29K 2023/00* (2013.01); *B29K 2063/00* (2013.01); *B29K 2067/00* (2013.01); *B29L 2031/34* (2013.01); *C08K 5/521* (2013.01); *C08L 2201/02* (2013.01); *C08L 2203/206* (2013.01); *C08L 2205/03* (2013.01); *C08L 2205/035* (2013.01); *H01L 2924/0002* (2013.01)

(58) Field of Classification Search
 CPC ............ C08L 2201/02; C08L 2205/03; C08L 2203/206; C08L 2205/035; H01L 23/293; H01L 23/3107; H01L 2924/0002; B29K 2023/00; B29K 2063/00; B29K 2067/00; B29L 2031/34; C08K 5/521
 USPC ........................................................ 523/451
 See application file for complete search history.

(56) References Cited

U.S. PATENT DOCUMENTS

| 2004/0127611 | A1 | 7/2004 | Yamanaka et al. | |
|---|---|---|---|---|
| 2004/0222564 | A1 | 11/2004 | Nishida et al. | |
| 2005/0256293 | A1 | 11/2005 | Yamanaka et al. | |
| 2005/0288402 | A1* | 12/2005 | Kosaka | C08K 5/0066 524/90 |
| 2010/0130654 | A1* | 5/2010 | Layman, Jr. | C07F 9/12 524/141 |

FOREIGN PATENT DOCUMENTS

| JP | 2000-103953 | 4/2000 |
|---|---|---|
| JP | 2002-523545 | 7/2002 |
| JP | 2004-83918 | 3/2004 |
| JP | 3553559 | 5/2004 |
| JP | 2010-150392 | 7/2010 |
| JP | 2010-150471 | 7/2010 |
| JP | 2011-153296 | 8/2011 |
| JP | 2011-195815 | 10/2011 |
| TW | 200811275 | 3/2008 |
| WO | 2007/007663 | 1/2007 |

OTHER PUBLICATIONS

Office Action dated Jun. 20, 2016 in corresponding Chinese Application No. 201380044674.5, with English translation.
Office Action dated Nov. 2, 2015 in corresponding Chinese Application No. 201380044674.5, with English translation.
Extended European Search Report dated Mar. 9, 2016, in European Application No, 13834231.6.
Office Action dated Aug. 11, 2016 in corresponding Taiwanese Application No. 102130644, with English translation.
Notification of Reasons for Rejection dated Sep. 20, 2016 in corresponding Japanese Application No. 2014-532936, with English translation.
The Third Office Action dated Oct. 24, 2016 in corresponding Chinese Application No. 201380044674.5, with English translation.
Decision of Rejection dated Mar. 20, 2017 in corresponding Chinese Application No. 201380044674.5, with English Translation.
International Search Report dated Oct. 8, 2013 in International (PCT) Application No. PCT/JP2013/072166.
Communication pursuant to Article 94(3) EPC dated Aug. 29, 2017 in European Application No. 13 834 231.6.

* cited by examiner

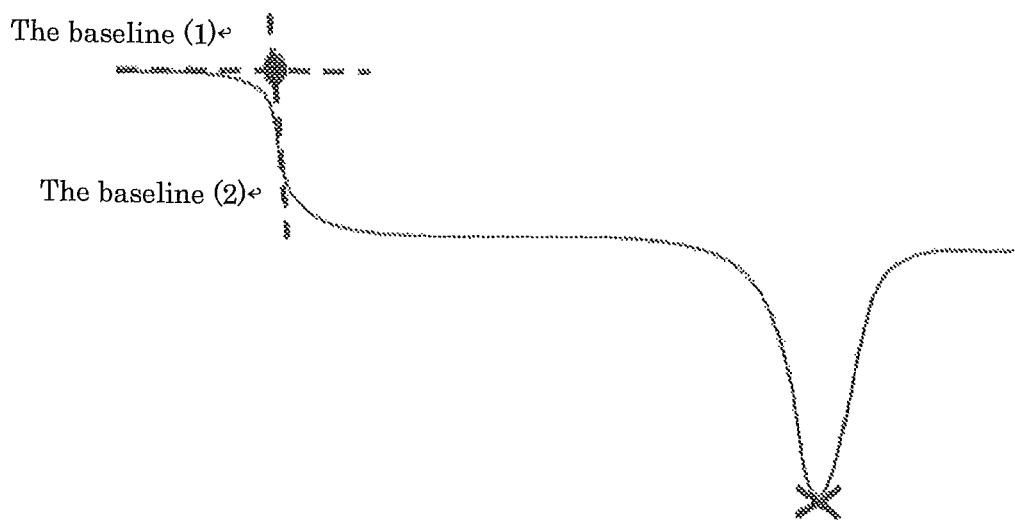

RESIN COMPOSITION FOR SEALING ELECTRICAL ELECTRONIC PARTS, METHOD OF PRODUCING ELECTRICAL ELECTRONIC PARTS, AND SEALED ELECTRICAL ELECTRONIC PARTS

TECHNICAL FIELD

The present invention relates to a sealed electrical electronic part sealed by a resin composition, its production method, and a resin composition suitable for this application.

BACKGROUND ART

It is indispensable for an electrical electronic component used widely in vehicles and electrical appliances to be electrically insulated from outsides for satisfying its use purpose. For example, an electrical wire is coated with a resin having an electrical insulation property. Today, applications in which electrical electronic parts with complicated shapes are required to be packed in a small capacity, e.g., mobile phones, are sharply increased and in such a situation, various methods for their electrical insulation are employed. In particular, when an electrical and electronic part such as a circuit board having a complicated shape is sealed with a resin which serves as an electrical insulator, a sealing method in which the resin certainly flows along the shape of the electrical and electronic part without causing short shot is required, and the resin is needed to have such a adhesive durability that an electrical insulating property would be maintained for an extended period of time. For that, it is common to employ a method for decreasing the viscosity of a sealing resin composition at the time of coating. A hot melt resin for sealing whose viscosity is lowered only by heating and melting to make sealing possible can be solidified to give a sealed body merely by cooling after sealing and thus has a high productivity, and in addition, since a thermoplastic resin is commonly used therefor, the resin can be melted and removed by heating after the life as a product is finished, thereby easily making recycling of the component possible.

Having both a high electrical insulation property and water-proofness, a polyester is supposed to be a very useful material for the above-mentioned application; however, in general, a polyester has a high melt viscosity and it is necessary to carry out injection molding at a high pressure of several hundred MPa or more in the case of sealing a component with a complicated shape, and there is a risk of breaking an electrical electronic part. Patent Document 1 discloses an adhesive composition for a structure, containing a specified polytetramethylene glycol copolymerized polyether ester elastomer and an epoxy compound having at least 1.2 or more of glycidyl groups on a number average basis in the molecule. Herein, the polyester resin used herein has good initial adhesive property but tends to have high crystallinity, and thus generates strain energy at the time of transfer from the amorphous state to the crystalline state after bonding, and therefore, the adhesive strength tends to be lowered significantly and the polyester resin is unsuitable for a sealing material for electrical electronic parts.

Patent Documents 2 and 3 propose a hot melt resin composition for sealing having a melt viscosity that enables sealing at a low pressure so as not to damage electrical electronic parts. The resin composition allows molded components with good initial adhesive property to be obtained and allows a polyester-based resin composition to be applied to common electrical electronic parts. However, these materials for sealing electrical and electronic parts have a problem that, despite often being required to have flame retardancy because of apprehensions about tracking or the like, they have high flammability.

Patent Document 4 discloses a resin composition for sealing electrical and electronic parts which contains a crystalline polyester resin, an epoxy resin, and a polyolefin resin are blended. This composition is high in adhesive strength, but has, similarly to the above-mentioned compositions, the drawback of having very high flammability.

PRIOR ART DOCUMENTS

Patent Documents

Patent Document 1: JP-A No. Sho 60-18562
Patent Document 2: Japanese Patent No. 3553559
Patent Document 3: JP-A No. 2004-83918
Patent Document 4: JP-A No. 2010-150471

SUMMARY OF THE INVENTION

Problem to be Solved by the Invention

As described above, no conventional technique suggests a resin composition for sealing electrical and electronic parts having a complicated shape which sufficiently satisfies all the performance requirements. Further, no conventional technique has provided a resin composition for sealing electrical and electronic parts which has such high flame retardancy that the total burning time is within 30 seconds after a flat plate of 125 mm×13 mm×2 mm is twice contacted with a flame of 2 mm in height for 10 seconds using, for example, a Bunsen burner and moved away from the flame.

It is an object of the present invention is to provide a resin composition for sealing electrical and electronic parts having excellent adhesive property. Further objects of the present invention are to provide a resin composition for sealing electrical and electronic parts which combines adhesive property with flame retardancy; to provide a method for producing sealed electrical and electronic parts suitable for the composition; and to provide a sealed electrical and electronic part.

Solution to the Problems

The inventors have conducted extensive investigations with a view to achieving the above objects, and as a result, the inventors now propose the following invention. That is, the present invention is to provide the following resin composition for sealing electrical and electronic parts, a method for producing a sealed electrical and electronic part suitable for the composition, and a sealed electrical and electronic part.

A resin composition for sealing electrical and electronic parts, comprising:
a copolymerized polyester (A) containing a polyalkylene glycol component and/or a polylactone component;
an epoxy resin (B);
a polyolefin resin (C); and
a phosphoric ester (D).

The polyester (A) is preferably a copolymer which contains the polyalkylene glycol component and/or the polylactone component in a total amount of 20 to 80% by weight.

The epoxy resin (B) is preferably a phosphorus-containing epoxy resin (B1) and/or a phosphorus-free epoxy resin (B2).

The phosphorus-containing epoxy resin (B1) is preferably a mixture of a compound of general formula (1) and a compound of general formula (2) and/or a compound of general formula (3);

[Chem. 1]

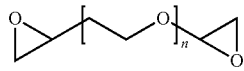

(general formula (1))

wherein n is an integer of 1 to 50,

[Chem. 2]

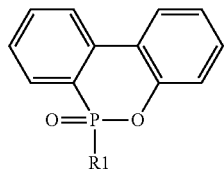

(general formula (2))

wherein R1 is hydrogen, a linear or branched alkyl group having 1 to 6 carbon atoms, or a linear or branched hydroxyalkyl group having 1 to 6 carbon atoms and having up to 3 hydroxyl groups at each end, and

[Chem. 3]

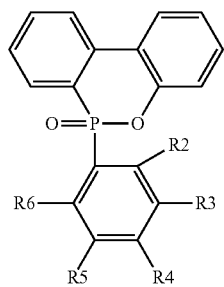

(general formula (3))

wherein R2 to R6 are each independently hydrogen, a hydroxyl group, a linear or branched alkyl group having 1 to 6 carbon atoms, or a linear or branched hydroxyalkyl group having 1 to 6 carbon atoms and having up to 3 hydroxyl groups at each end.

The ratio of the compound of general formula (1) to the total of the compound of general formula (2) and/or the compound of general formula (3) is preferably 99.9/0.1 to 0.1/99.9 (% by weight).

The phosphoric ester (D) comprises preferably isopropylated triaryl phosphate of formula (4) and/or triphenylphosphate of formula (5) in a ratio of 100/0 to 0/100 (% by weight):

[Chem. 4]

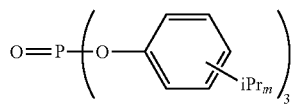

(formula (4))

wherein m is an integer of 1 to 5, and

[Chem. 5]

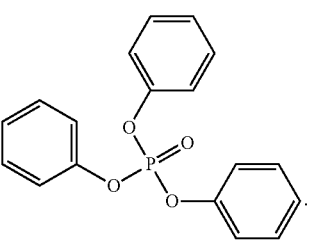

(formula (5))

The resin composition for sealing electrical and electronic parts comprises preferably 0.1 to 50 parts by weight of the epoxy resin (B), 0.5 to 80 parts by weight of the polyolefin resin (C), and 0.1 to 20 parts by weight of the phosphoric ester (D), based on 100 parts by weight of the polyester (A).

The resin composition for sealing electrical and electronic parts further comprises preferably an alkyl benzene resin (E) and/or a phenol resin (F).

The alkyl benzene resin (E) is preferably an alkylphenol-modified alkyl benzene resin and has a hydroxyl value of 100 equivalents/$10^6$ g or more.

The phenol resin (F) is a novolac type phenol resin and has a hydroxyl value of 100 equivalents/$10^6$ g or more.

The resin composition for sealing electronic and electrical parts comprises preferably a total of 0.1 to 45 parts by weight of the alkyl benzene resin (E) and/or the phenol resin (F), based on 100 parts by weight of the polyester (A).

The resin composition for sealing electrical and electronic parts has an initial T-type peeling strength to a glass epoxy substrate of 25 N/20 mm or more.

A method for producing sealed electrical and electronic parts, comprises:
heating and kneading the resin composition; and
thereafter injecting the resin composition into a mold including an inserted electrical and electronic part at a resin composition temperature of 130° C. or more and 260° C. or less and at a resin composition pressure of 0.1 MPa or more and 20 MPa or less.

A sealed electrical and electronic part is sealed with the resin composition.

Effects of the Invention

The resin composition for sealing electrical and electronic parts of the present invention is excellent in adhesive property to a glass epoxy substrate when used as a sealing material for sealed electrical and electronic parts. Further, the resin composition of the present invention exhibits such high flame retardancy that the total burning time is within 30 seconds after a flat plate of 125 mm×13 mm×2 mm is twice contacted with a flame of 2 mm in height for 10 seconds using, for example, a Bunsen burner and moved away from the flame. Therefore, the electrical and electronic parts sealed with the resin composition for sealing electrical and electronic parts of the present invention exhibit flame retardancy.

BRIEF DESCRIPTION OF THE DRAWING

FIG. 1 shows a schematic diagram of a chart obtained by measurement with a differential scanning calorimeter.

MODE FOR CARRYING OUT THE INVENTION

The sealed electrical and electronic part of the present invention can be produced by injecting a resin or resin composition which is heated and kneaded to provide flowability thereto into a mold in which an electrical and electronic part is set in the internal of the mold, at a low pressure of 0.1 to 20 MPa, and holding and sealing the electrical and electronic part by the resin or resin composition. More specifically, as compared to a conventional injection molding at a high pressure of 40 MPa or more generally used in the plastic molding, at much lower pressure. Thus, while sealing is provided by an injection molding method, an electrical and electronic part having limited heat resistance and pressure resistance can be sealed without being broken. Appropriate selection of a sealing resin or a sealing resin composition can provide a sealed part which has adhesive property to a metal member and a glass epoxy substrate, and flame retardancy. Hereinafter, the embodiments of the present invention will be described in detail step by step.

<Polyester (A)>

The polyester used in the present invention is not particularly limited, comprises a chemical structure in which a hard segment mainly consisting of a polyester segment and a soft segment mainly consisting of a polycarbonate segment, a polyalkylene glycol segment and/or a polylactone segment are combined by an ester bond. It is preferred that the polyester segment mainly comprise polyester of a structure that can be formed by polycondensation of an aromatic dicarboxylic acid, an aliphatic glycol and/or an alicyclic glycol. The soft segment is contained in an amount of preferably 20% by weight or more and 80% by weight or less, more preferably 30% by weight or more and 70% by weight or less, and further preferably 40% by weight or more and 60% by weight or less, based on the whole copolymer polyester elastomer.

The upper limit of the ester group concentration of the polyester resin (A) used in the present invention, is desirably 8000 equivalent/$10^6$ g. The upper limit is preferably 7500 equivalent/$10^6$ g and more preferably 7000 equivalent/$10^6$ g. In addition, for securing chemical resistance (to gasoline, engine oil, alcohol, general purpose solvent, and the like), the lower limit is desirably 1000 equivalent/$10^6$ g. The lower limit is preferably 1500 equivalent/$10^6$ g and more preferably 2000 equivalent/$10^6$ g. Herein, the unit of the ester group concentration is expressed by the equivalent number per $10^6$ g of the resin, and is the value calculated from the composition of the polyester resin and the copolymerization ratio thereof.

The lower limit of the number average molecular weight of the polyester (A) used in the present invention is not particularly limited, and is preferably from 3,000 or more, more preferably from 5,000 or more, and further preferably from 7,000 or more. In addition, the upper limit of the number average molecular weight is not particularly limited, and is preferably from 60,000 or less, more preferably from 50,000 or less, and further preferably from 40,000 or less. When the number average molecular weight is too low, hydrolysis resistance of the resin composition for sealing and high retention of elongation under high temperature and high humidity may be insufficient, and when the number average molecular weight is too high, the melt viscosity of the resin composition may be increased, and the molding pressure may be too high, and molding may be difficult.

The polyester (A) used in the present invention preferably a saturated polyester resin, and also preferably an unsaturated polyester resin having a small amount of vinyl groups of 50 equivalent/$10^6$ g or less. In the case of an unsaturated polyester having a high concentration of vinyl groups, there is a possibility such that crosslinking occurs upon melting, and may have poor melt stability.

The polyester (A) used in the present invention may be a branched polyester obtained by copolymerizing polycarboxylic acids or polyols having three or more functional groups such as trimellitic anhydride and trimethylolpropane, as necessary.

In order to mold the polyester (A) used in the present invention without causing thermal degradation as much as possible, rapid melting at 210 to 240° C. is required. Therefore, the upper limit of the melting point of the polyester (A) is desirably 210° C. The upper limit is preferably 200° C. and more preferably 190° C. Considering handling properties at ordinary temperature and normal heat resistance, the upper limit is 70° C. or more, preferably 100° C. or more, further preferably 120° C. or more, particularly preferably 140° C. or more, and most preferably 150° C. or more.

As the method for producing the polyester (A) of the present invention, a known method can be adopted, and for example, a target polyester resin can be obtained by esterifying the dicarboxylic acid described above and a diol component at 150 to 250° C., then polycondensing the reactant at 230 to 300° C. while reducing the pressure. Alternatively, a target polyester resin can be obtained by esterifying using a derivative such as a dimethyl ester of the dicarboxylic acid described above and a diol component at 150° C. to 250° C., then polycondensing the reactant at 230° C. to 300° C. while reducing the pressure.

<Hard Segment of Polyester (A)>

It is preferred that the hard segment of the polyester (A) of the present invention is mainly comprised of a hard segment consisting of a polyester segment.

The acid component constituting the polyester segment is not particularly limited, and it is preferred that an aromatic dicarboxylic acid of 8 to 14 carbon atoms be contained in 50% by mol or more of the total acid components, in terms of a design to have high melting point for increasing heat resistance of the copolymer polyester elastomer. In addition, when the aromatic dicarboxylic acid having 8 to 14 carbon atoms is terephthalic acid and/or naphthalenedicarboxylic acid, it is highly reactive with glycol, and is desirable in terms of polymerizability and productivity. The total of terephthalic acid and naphthalenedicarboxylic acid is more preferably 60% by mol or more, more preferably 80% by mol or more, and further preferably 95% by mol or more, of the total acid components of the copolymer polyester elastomer, and the total acid components may be constituted by terephthalic acid and/or naphthalenedicarboxylic acid.

Other acid components constituting the polyester segment include dicarboxylic acids such as aromatic carboxylic acids such as diphenyl carboxylic acid, isophthalic acid and sodium 5-sulisophthalic acid, alicyclic dicarboxylic acids such as cyclohexanedicarboxylic acid and tetrahydrophthalic anhydride, and aliphatic dicarboxylic acids such as succinic acid, glutaric acid, adipic acid, azelaic acid, sebacic acid, dodecanedioic acid, dimer acid and hydrogenated dimer acid. These dicarboxylic acids were used in the range that the melting point of the polyester (A) is not greatly lowered, and the copolymerization ratio is 40% by mol or less and preferably 20% by mol or less of the total acid components. In addition, as other acid components constituting the polyester segment, it is also possible to use a polycarboxylic acid having three or more functional groups such as trimellitic anhydride and pyromellitic acid. The copolymerization ratio of the polycarboxylic acid having three or more functional groups is preferably 10% by mol or less and more preferably 5% by mol or less, from the viewpoint of inhibiting gelation of the resin composition.

In addition, the aliphatic glycol and/or alicyclic glycol constituting the polyester segment is not particularly limited, but the aliphatic glycol and/or alicyclic glycol having 2 to 10 carbon atoms based on the total glycol components is preferable, and the alkylene glycols having 2 to 8 carbon atoms is more preferable. The aliphatic glycol and/or alicyclic glycol preferably contains 50% mol or more based on the total glycol components, and more preferably 70% mol or more. Specific examples of the preferred glycol components include ethylene glycol, 1,3-propylene glycol, 1,4-butanediol, 1,6-hexanediol, 1,4-cyclohexanedimethanol, and the like. 1,4-Butanediol and 1,4-cyclohexanedimethanol are most preferable in terms of a design to have high melting point for increasing heat resistance of the polyester elastomer. Also, as a part of the glycol component, the polyols having three or more functional groups such as glycerin, trimethylolpropane and pentaerythritol may be used, the ratio is preferably 10% by mol or less and more preferably 5% by mol or less, from the viewpoint of inhibiting gelation of the resin composition.

As the component constituting the polyester segment, those consisting of a butylene terephthalate unit or a butylene naphthalate unit are particularly preferred, in terms of its capable of making the melting point of the polyester elastomer higher to increase heat resistance and also moldability and cost performance.

<Soft Segment of Polyester (A)>

It is preferred that the soft segment of the polyester (A) of the present invention mainly comprise a soft segment mainly consisting of a polyalkylene glycol segment, and/or a polylactone segment. The copolymerization ratio of the soft segment is preferably 1% by mol or more, more preferably 5% by mol or more, further preferably 10% by mol or more and particularly preferably 20% by mol or more, based on 100% by mol of the total glycol components constituting the polyester (A). In addition, the copolymerization ratio of the soft segment is preferably 90% by mol or less, more preferably 55% by mol or less, further preferably 50% by mol or less, and particularly preferably 45% by mol or less. When the copolymerization ratio of the soft segment is too low, it tends to cause problems that the melt viscosity of the resin composition of the present invention is increased, thus the resin composition cannot be molded at low pressure, or the crystallization rate is high to cause a short shot, and the like. In addition, the copolymerization ratio of the soft segment is too high, and it tends to cause problems that heat resistance of the sealed body of the present invention is insufficient, and the like.

The number average molecular weight of the soft segment is not particularly limited, but is preferably 400 or more, and more preferably 800 or more. When the number average molecular weight of the soft segment is too low, flexibility cannot be imparted, and it tends to cause a problem that the stress load to an electronic substrate after sealing is increased. In addition, the number average molecular weight of the soft segment is preferably 5000 or less, and more preferably 3000 or less. When the number average molecular weight is too high, it tends to cause a problem that compatibility with other copolymer components is low, thus the soft segment cannot be copolymerized.

Specific examples of the polyalkylene glycol segments used in the soft segment include polyethylene glycol, polytrimethylene glycol, polytetramethylene glycol, and the like. Polytetramethylene glycol is most preferable in terms of imparting flexibility and reducing melt viscosity.

Specific examples of the polylactone segments used in the soft segment include polycaprolactone, polyvalerolactone, polypropiolactone, polyundecalactone, poly(1,5-oxetan-2-one), and the like.

The polyester (A) in the present invention may be non-crystalline or crystalline. Crystalline polyester resins, however, are more preferred.

<Epoxy Resin (B)>

The epoxy resin (B) used in the present invention may be a phosphorus-containing epoxy resin (B1) or a phosphorus-free epoxy resin (B2). Further, a combination of the phosphorus-containing epoxy resin (B1) and the phosphorus-free epoxy resin (B2) can be used.

<Phosphorus-Containing Epoxy Resin (B1)>

The phosphorus-containing epoxy resin (B1) used in the present invention is not particularly limited, but is preferably a mixture of an ether compound of general formula (1) and a compound of general formula (2) and/or a compound of general formula (3).

[Chem. 6]

(general formula (1))

wherein n is preferably an integer of 1 to 50, more preferably an integer of 2 to 45, and still more preferably an integer of 3 to 40.

[Chem. 7]

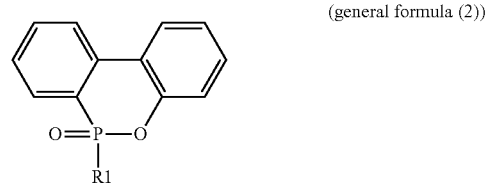

(general formula (2))

wherein R1 is preferably hydrogen, a linear or branched alkyl group having 1 to 6 carbon atoms, or a linear or branched hydroxyalkyl group having 1 to 6 carbon atoms and having up to 3 hydroxyl groups at each end. More preferably, when R1 is an alkyl group or a hydroxyalkyl group, the number of carbon atoms is, in either case, 6 or less, and still more preferably 4 or less. When the number of carbon atoms is 7 or more, the flammability may be adversely affected.

[Chem. 8]

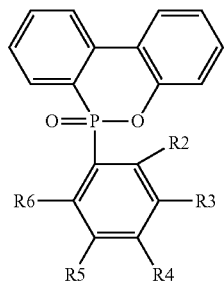

(general formula (3))

wherein R2 to R6 are preferably each independently hydrogen, a hydroxyl group, a linear or branched alkyl group having 1 to 6 carbon atoms, or a linear or branched hydroxyalkyl group having 1 to 6 carbon atoms and having up to 3 hydroxyl groups at each end. More preferably, when R2 to 6 have alkyl groups or hydroxyalkyl groups, the number of carbon atoms is 6 or less, further preferably 4 or less, and especially preferably 2 or less. When the number of carbon atoms is 7 or more, the flammability may be adversely affected. Further, when hydroxyl groups directly bonded to R2 to 6 are present, the total number of hydroxyl groups in R2 to 6 is preferably 6 or less, more preferably 3 or less, and most preferably 2 or less. It is acceptable that the number of hydroxyl groups directly bonded to the aromatic ring is large. However, when the number of the hydroxyl groups is small, the reaction with the above ether compound will easily take place and the compatibility with the polyester (A) in a composition will be further improved.

The ratio of a compound of general formula (1) to the total amount of a compound of general formula (2) and/or a compound of general formula (3) (that is, the compound of general formula (1)/the compound of general formula (2) and/or the compound of general formula (3)) is preferably 99.9/0.1 to 0.1/99.1 (% by weight), more preferably 99/1 to 1/99 (% by weight), still more preferably 95/5 to 5/95 (% by weight), particularly preferably 90/10 to 10/90 (% by weight), and most preferably 85/15 to 15/85 (% by weight).

When the compound of general formula (2) is used in combination with the compound of general formula (3), the ratio of the compound of general formula (2) to the compound of general formula (3) (that is, the compound of general formula (2)/the compound of general formula (3)) is preferably 90/10 to 10/90 (% by mole), more preferably 80/20 to 20/80 (% by mole), still more preferably 70/30 to 30/70 (% by mole), and particularly preferably 60/40 to 40/60 (% by mole).

In the present invention, the phosphorus-containing epoxy resin (B1) contained in the resin composition imparts to the resin excellent properties such as good flammability and good initial adhesive property. It is believed that, because the phosphorus-containing epoxy resin (B1) serves as a burning inhibitor during the burning of the polyester (A) having high flammability and at the same time the glycidyl groups contained in the composition impart appropriate dispersibility, good flame retardancy and good adhesive property are both implemented. The blending amount of the phosphorus-containing epoxy resin (B1) in the present invention is preferably 0.1 part by weight or more, more preferably 3 parts by weight or more, and still more preferably 5 parts by weight or more, based on 100 parts by weight of the polyester (A). Further, the blending amount is preferably 50 parts by weight or less, more preferably 40 parts by weight or less, and most preferably 30 parts by weight or less. When the blending amount of the phosphorus-containing epoxy resin (B1) is small, flammability and adhesive property can not be exhibited. When the blending amount is large, the physical properties of the resin, in particular resistance brittleness, may be decreased, resulting in lower tensile elongation retention.

The phosphorus-containing epoxy resin (B1) can be produced according to any known method. For example, 80 to 90% by weight of 9,10-dihydro-9-oxa-10-phosphaphenanthrene-10 oxide and 10 to 20% by weight of polyethyleneglycol glycidyl ether may be mixed and then heated to 150 to 160° C., followed by agitation and mixing to obtain the resin.

<Phosphorus-Free Epoxy Resin (B2)>

The phosphorus-free epoxy resin (B2) used in the present invention is not particularly limited, but is preferably an epoxy resin having a number average molecular weight in the range of 450 to 40,000 and having on average at least 1.1 glycidyl groups per molecule. Examples of the phosphorus-free epoxy resin (B2) may include glycidyl ether type epoxy resins such as bisphenol A diglycidyl ether, bisphenol S diglycidyl ether, novolac glycidyl ether, brominated bisphenol A diglycidyl ether or the like; glycidyl ester type epoxy resins such as hexahydrophthalic acid glycidyl ester, dimer acid glycidyl ester or the like; glycidyl amine such as triglycidylisocyanurate, glycidyl hydantoin, tetraglycidyldiamino diphenylmethane, triglycidyl p-aminophenol, triglycidyl m-aminophenol, diglycidylaniline, diglycidyltoluidine, tetraglycidyl m-xylenediamine, diglycidyl tribromoaniline, tetraglycidyl bisaminomethylcyclohexane or the like; and alicyclic or aliphatic epoxide type epoxy resins such as 3,4-epoxycyclohexylmethyl carboxylate, epoxidized polybutadiene, epoxidized soybean oil or the like. Among these, those which have good compatibility with the polyester (A) are preferable in view of imparting high adhesion. The number average molecular weight of the phosphorus-free epoxy resin (B2) is preferably 450 to 40,000. When the number average molecular weight is less than 450, an adhesive composition is very easily softened, and may be inferior in mechanical properties. When the number average molecular weight is more than 40,000, the compatibility with the polyester (A) is decreased and, adherence may be impaired.

When the phosphorus-free epoxy resin (B2) is blended with the polyester (A), the adhesive property may be expected to be further improved. It is believed that such improvement may be caused by the incorporation of two kinds of adhesive components which may further improve their dispersibility by a different mechanism. The blending amount of the phosphorus-free epoxy resin (B2) in the present invention is preferably 0.1 part by weight or more, more preferably 1 part by weight or more, and still more preferably 3 parts by weight or more, based on 100 parts by weight of the polyester (A). Further, the blending amount is preferably 30 parts by weight or less, more preferably 25 parts by weight or less, and still more preferably 20 parts by weight or less. When the blending amount of the phosphorus-free epoxy resin (B2) becomes too large, the blending amount of the polyester (A) becomes relatively small, in which case the adhesive property may be deteriorated and the physical properties of the resin may become poor.

A combination of the phosphorus-containing epoxy resin (B1) and the phosphorus-free epoxy resin (B2) may be used. The phosphorus-containing epoxy resin (B1) exhibits excellent flame retardancy, and the phosphorus-free epoxy resin (B2) exhibits excellent adhesive property. Hence, the combined use of both the resins may be expected to provide excellent adhesive property and flame retardancy by a synergistic effect.

<Polyolefin Resin (C)>

The polyolefin resin (C) used in the present invention is not particularly limited, but a low crystallinity polyolefin resin is preferably used. The low crystallinity polyolefin resin tends to have a density lower than that of a typical polyolefin resin, and preferably has a density of 0.75 g/cm$^3$ or more and less than 0.91 g/cm$^3$. When such a low crystallinity polyolefin resin having a low density is used as the polyolefin resin (C), the polyolefin resin (C) can easily be finely dispersed and mixed with the polyester (A) which is basically incompatible therewith, and a homogeneous resin composition can be obtained using a general twin-screw extruder. When such a low crystallinity polyolefin resin having a low density is used as the polyolefin resin (C), the polyolefin resin (C) properly acts on relaxation of residual stress over time at injection molding generated in the polyester resin (A), and exhibits preferable properties like imparting of long-term adhesive durability, and reduction in generated stress by environmental load as a sealing resin. As the polyolefin resin (C) having such properties, polyethylene and an ethylene copolymer are particularly preferred since these are easily availability, inexpensive, and adversely affect on adhesive property to metals and films. Specifically, the polyolefin resin (C) includes low density polyethylenes, very low density polyethylenes, linear low density polyethylenes, ethylene-α-olefin copolymers, ethylene propylene elastomers, ethylene-butene copolymers.

In addition, the polyolefin resin (C) is preferably one that does not contain a polar group that can react with a polyester resin (A) such as a carboxyl group and a glycigyl group. When a polar group is present, compatibility of the polyester (A) varies, and strain energy at crystallization of the polyester resin may not be able to be relaxed. Generally, a polyolefin having a polar group tends to have high compatibility with a polyester resin as compared to a polyolefin having no polar group, but in the present invention, when compatibility is increased, the decrease in adhesive property over time rather tends to be significant.

Still further, it is preferable for the polyolefin resin (C) of the present invention to have a melt lass flow rate (hereinafter, abbreviated as MFR) of 3 to 20 g/10 min measured in condition D of JIS K 7210-1999 (testing temperature 190° C. and normal load 2.16 kg). If MFR is less than 3, the melt viscosity is too high, and thus the compatibility with the polyester (A) is deteriorate and adhesive property may be impaired, and if MFR is beyond 20, the viscosity is low and the adhesive composition is extremely easily softened, and the mechanical properties may be inferior.

In the present invention, by blending the polyolefin resin (C) in the resin composition for sealing, when sealing electrical and electronic parts, excellent property like good initial adhesive property is exhibited. The polyolefin resin (C) is considered to exhibit an effect of relaxing strain energy generated by crystallization of the polyester (A) and relaxation of enthalpy. The blending amount of the polyolefin resin (C) in the present invention is preferably 0.5 parts by weight or more, more preferably 10 parts by weight or more, and particularly preferably 15 parts by weight or more, based on 100 parts by weight of the polyester (A). The blending amount of the polyolefin resin (C) in the present invention is preferably 80 parts by weight or less, more preferably 60 parts by weight or less, and particularly preferably 50 parts by weight or more, based on 100 parts by weight of the polyester (A). When the blending amount of the polyolefin resin (C) is low, crystallization of the polyester (A) and strain energy by enthalpy relaxation are difficult, thus adhesive strength tends to be lowered. Also, when the blending amount of the polyolefin resin (C) is high, adhesive property and resin physical properties tend to be conversely lowered. In addition, the polyester (A) and the polyolefin resin (C) cause macro phase separation to lower breaking elongation, and it may adversely affect on moldability such that a smooth surface is not obtained.

<Phosphoric Ester (D)>

The phosphoric ester (D) used in the present invention is not particularly limited, but a composition in which the constituent ratio of isopropylated triaryl phosphate of formula (4) to triphenylphosphate of formula (5) is 100/0 to 0/100 (% by weight) is preferable, and the constituent ratio is more preferably 99/1 to 1/99 (% by weight), still more preferably 95/5 to 5/95 (% by weight), still further preferably 90/10 to 10/90 (% by weight), particularly preferably 80/20 to 20/80 (% by weight), and most preferably 60/40 to 40/60 (% by weight). As the blending amount of isopropylated triaryl phosphate increases, the flowability during molding may be decreased due to high kinematic viscosity.

[Chem. 9]

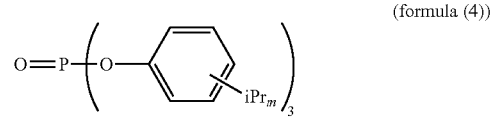

(formula (4))

wherein iPr represents an isopropyl group, and m is preferably an integer of 1 to 5, and more preferably an integer of 2 to 4.

[Chem. 10]

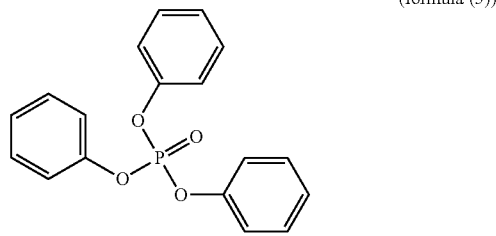

(formula (5))

In the present invention, when the phosphoric ester (D) is blended with the polyester (A), the resin composition can have excellent flame retardancy and flowability. This is likely because the phosphoric ester (D) has excellent incombustibility and the phosphoric ester (D) has a low viscosity under high temperature in comparison to the polyester (A). The blending amount of the phosphoric ester (D) in the present invention is preferably 0.1 part by weight or more, more preferably 3 parts by weight or more, and still more preferably 5 parts by weight or more, based on 100 parts by weight of the polyester (A). Further, the blending amount is preferably 20 parts by weight or less, more preferably 18 parts by weight or less, and still more preferably 15 parts by weight or less. When the blending amount is too small, flame retardancy may not be imparted to the polyester (A). Conversely, when the blending amount is too large, the physical properties of the resin may be deteriorated and bleed out may occur.

Further, in the present invention, the incorporation of both the phosphorus-containing epoxy resin (B1) and the phosphoric ester (D) may provide very excellent flame retardancy based on their synergistic effect.

<Alkyl Benzene Resin (E)>

An alkyl benzene resin (E) used in the present invention is not particularly limited, but phenol-modified alkyl benzene resin obtained by modifying an alkyl benzene resin with phenol is preferable, more preferably an alkyl phenol-modified alkyl benzene resin and still more preferably an alkyl phenol-modified mesitylene resin. The alkyl benzene resin preferably has a number average molecular weight in the range of 450 to 40,000. The alkyl benzene resin refers to a multimer composition of a basic structure in which alkyl benzenes such as xylene are cross-linked with methylene groups and ether bonds, and typically can be obtained by meta-xylene and formaldehyde are heated in the presence of a sulfuric acid. The methylene resin refers to a multimer composition of a basic structure in which methylene structures are cross-linked with methylene groups and ether bonds, and typically can be obtained by methylene and formaldehyde are heated in the presence of a sulfuric acid. In addition, the alkyl benzene resin (E) of the present invention has a hydroxyl value of preferably 100 equivalent/$10^6$ g or more, more preferably 1000 equivalent/$10^6$ g or more, and further preferably 5000 equivalent/$10^6$ g or more. In addition, the hydroxyl value is preferably 20000 equivalent/$10^6$ g or less and more preferably 15000 equivalent/$10^6$ g or less. When the hydroxyl value is too low, adhesive property to an aluminum material tends to be lowered, and when the hydroxyl value is too high, water absorbency tends to increase and insulation property tends to lower. The hydroxyl value herein referred to is those measured according to JIS K 1557-1: 2007A method.

<Phenol Resin (F)>

The phenol resin (F) used in the present invention is a resin obtained by a reaction of a phenol and an aldehyde, may be a novolac type phenol resin or a cresol type phenol resin, and preferably has a number average molecular weight in the range of 450 to 40,000. Phenols that can be used as a starting material of the phenol resin include bifunctional phenols such as o-cresol, p-cresol, p-tert-butylphenol, p-ethyl phenol, 2,3-xylenol and 2,5-xylenol, trifunctional phenols such as phenol, m-cresol, m-ethylphenol, 3,5-xylenol and m-methoxy phenol, tetrafunctional phenols such as bisphenol A and bisphenol F, and a combined use of one or two or more types of those various phenols. In addition, as formaldehydes used in the production of a phenol resin, one or two or more types of formaldehyde, paraformaldehyde, trioxane and the like can be concurrently used. Besides, phenol-modified resins such as phenol aralkyl and phenol-modified xylene resins are cited. Among them, particularly, in order to exhibit high adhesive force, it is preferred to select one having good compatibility with the polyester (A). In order to obtain a phenol resin having good compatibility with the polyester (A), it is preferred to have a close melt viscosity and have hydroxyl groups. In addition, the phenol resin (F) of the present invention has a hydroxyl value of preferably 100 equivalent/$10^6$ g or more, more preferably 500 equivalent/$10^6$ g or more, and further preferably 1000 equivalent/$10^6$ g or more. In addition, the hydroxyl value is preferably 10000 equivalent/$10^6$ g or less and more preferably 5000 equivalent/$10^6$ g or less. When the hydroxyl value is too low, adhesive property to an aluminum material tends to be lowered, and when the hydroxyl value is too high, water absorbency tends to increase and insulation property tends to lower. The hydroxyl value herein referred to is those measured according to JIS K 1557-1: 2007A method.

In the present invention, when the alkyl benzene resin (E) and/or the phenol resin (F) is incorporated into a sealing resin composition, good adhesive property may be exhibited when sealing electrical and electronic parts. The alkyl benzene resin (E) and/or the phenol resin (F) is believed to exert a stress relaxation effect by delaying the crystallization of the polyester (A), an effect as a dispersion aid for the polyester (A) and the polyolefin resin (C), and an effect to improve substrate wettability by the introduction of functional groups. The blending amount of the alkyl benzene resin (E) and/or the phenol resin (F) in the present invention is preferably 0.1 part by weight or more, more preferably 1 part by weight or more, and still more preferably 3 parts by weight or more, based on 100 parts by weight of the polyester (A). Further, it is preferably 45 parts by weight or less, more preferably 35 parts by weight or less, and still more preferably 25 parts by weight or less. When the blending ratio of the alkyl benzene resin (E) and/or the phenol resin (F) is too low, the stress relaxation effect by delaying the crystallization may not be exhibited, and the effect as a dispersion aid for the polyolefin resin (C) and the polyester (A) may not be exhibited. On the other hand, when the blending ratio of the alkyl benzene resin (E) and/or the phenol resin (F) is too high, the productivity of the resin composition may be decreased due to difficulty of the pelletization of strands when kneading, and the flexibility of a sealed part may be decreased.

The sealing resin composition of the present invention may without problems contain other resins such as a polyester, a polyamide, a polyolefin, a polycarbonate, an acrylic, and ethylene vinyl acetate, which are not any of the polyester (A), the epoxy resin (B), the polyolefin resin (C), the phosphoric ester (D), the alkyl benzene resin(E) and the phenol resin (F) in the present invention; curing agents such as an isocyanate compound and melamine; fillers such as talc and mica; pigments such as carbon black and titanium oxide; and flame retardants such as antimony trioxide and brominated polystyrene. Adding these components may be improve adhesive property, flexibility, durability and the like. The polyester (A) at that time is preferably 50% by weight or more, more preferably 60% by weight or more and still more preferably 70% by weight or more, based on the total composition. When the content of the polyester (A) is less than 50% by weight, adhesive property, adhesive durability, elongation retention, hydrolysis resistance and water resistance to an excellent electrical and electronic part, that are exhibited by the polyester resin (A) itself, may be lowered.

In the case where the sealed part of the present invention is exposed to a high temperature and high humidity environment for a long time, an antioxidant is preferably added to the resin composition. Examples of preferred antioxidants include, as hindered phenol-based antioxidants, 1,3,5-tris(3,5-di-t-butyl-4-hydroxybenzyl) isocyanurate, 1,1,3-tri(4-hydroxy-2-methyl-5-t-butylphenyl) butane, 1,1-bis(3-t-butyl-6-methyl-4-hydroxyphenyl) butane, 3,5-bis(1,1-dimethylethyl)-4-hydroxy-benzenepropanoic acid, pentaerythrityl tetrakis(3,5-di-t-butyl-4-hydroxyphenyl) propionate, 3-(1,1-dimethylethyl)-4-hydroxy-5-methyl-benzenepropanoic acid, 3,9-bis[1,1-dimethyl-2-[(3-t-butyl-4-hydroxy-5-methylphenyl)propionyloxyl-]ethyl]-2,4,8,10-tetraoxaspiro[5.5]undecane and 1,3,5-trimethyl-2,4,6-tris(3', 5'-di-t-butyl-4'-hydroxybenzyl)benzene, as phosphorus-based antioxidants, 3,9-bis(p-nonylphenoxy)-2,4,8,10-tetraoxa-3,9-diphosphataspiro[5.5]undecane, 3,9-bis(octadecyloxy)-2,4,8,10-tetraoxa-3,9-diphosphaspiro[5.5]undecane, tri(monononylphenyl)phosphite, triphenoxyphosphine, isodecyl phosphite, isodecyl phenyl phosphite, diphenyl 2-ethylhexyl phosphite, dinonylphenyl bis(nonylphenyl)ester phosphorous acid, 1,1,3-tris(2-methyl-4-ditridecylphosphite-5-t-butylphenyl) butane, tris(2,4-di-t-butylphenyl)phosphite, pentaerythritol bis(2,4-di-t-butylphenyl phosphite), 2,2'-methylenebis(4,6-di-t-butylphenyl) 2-ethylhexyl phosphite and bis(2,6-di-t-butyl-4-methylphenyl)pentaerythritol diphosphite, and as thioether-based antioxidants, 4,4'-thiobis[2-t-butyl-5-methylphenol]bis[3-(dodecylthio)propionate], thiobis[2-(1,1-dimethylethyl)-5-methyl-4,1-phenylene]bis[3-(tetradecylthio)-propionate], pentaerythritol tetrakis(3-n-dodecylthiopropionate), bis(tridecyl)thiodipropionate, and these can be used alone or in form of a composite. The amount added is preferably 0.1% by weight or more and 5% by weight or less, based on the total resin composition for sealing. When the amount is less than 0.1% by weight, deterioration prevention effect may become poor. Also, when the amount exceeds 5% by weight, it may adversely affect on adhesive property or the like.

Further, when the sealed part of the present invention is required to have weathering resistance, a light stabilizer may preferably be added. Examples of a benzotriazole-based light stabilizer may include, but are not limited to, 2-(3,5-di-tert-amyl-2'hydroxyphenyl)benzotriazole, 2-(2-hydroxy-5-tert-octylphenyl)benzotriazole, 2-(2'-hydroxy-3'-tert-butyl-5'-methylphenyl)-5-chlorobenzotriazole, 2-(2H-benzotriazol-2-yl)-p-cresol, 2-(2'-hydroxy-5'-methylphenyl)-benzotriazole, 2,4-di-tert-butyl-6-(5-chlorobenzotriazol-2-yl)phenol, and 2-[2-hydroxy-3,5-di(1, 1-dimethylbenzyl)]-2H-benzotriazole. Any benzotriazole-based light stabilizer may be used as appropriate. Examples of a benzophenon-based light stabilizer may include, but are not limited to, 2-hydroxy-4-(octyloxe)benzophenon, 2,4-dihydroxybenzophenon, 2-hydroxy-4-methoxybenzophenon, 2-hydroxy-4-methoxybenzophenon, 2-hydroxy-4-methoxybenzophenon-5-sulfonic acid, 2-hydroxy-4-n-dodecyloxybenzophenon, bis(5-benzoyl-4-hydroxy-2-methoxyphenyl)methane, 2,2'-dihydroxy-4-methoxybenzophenon, 2,2'-dihydroxy-4,4'-dimethoxybenzophenon. Any benzophenon-based light stabilizer may be used as appropriate. Examples of a hindered amine-based light atabilizer may include, but are not limited to, bis(2,2,6,6,-tetramethyl-4-piperidyl)sebacate, poly(4-hydroxy-2,2,6,6,-tetramethyl-1-piperidine ethanolalt-1,4-butanedioic acid), poly[{6-(1,1,3,3-tetramethylbutyl)amino-1,3,5-triazine-2,4-diyl}{(2,2,6,6-tetramethyl-4-piperidyl)imino}hexamethylene<2,2,6,6-tetramethyl-4-piperidyl)imino}], 1,3,5-tris(3,5-di-tert-butyl-4-hydroxybenzil)-s-triazine-2,4,6(1H,3H,5H) trione, tris(4-tert-butyl-3-hydroxy-2,6-dimethylbenzil)-s-triazine-2,4,6 (1H,3H,5H)trione. Any hindered amine-based light stabilizer may be used as appropriate. Examples of a nickel-based light stabilizer may include, but are not limited to, [2,2'-thio-bis(4-tert-octylphenolate)]-2-ethylhexylamine-nickel (II), Nickel-dibutyldithiocarbamate, [2,2'-thio-bis(4-tert-octylphenolate)]-n-buthylamine-nickel. Any nickel-based light stabilizer may be used as appropriate. Examples of a benzoate-based light stabilizer may include, but are not limited to, 2,4-di-t-butylphenyl-3,5'-di-tert-butyl-4'-hydroxybenzoate. Any benzoate-based light stabilizer may be used as appropriate. The amount added is preferably 0.1% by weight or more and 5% by weight or less, based on the total resin composition for sealing. When the amount is less than 0.1% by weight, weathering resistance effect may become poor. Also, when the amount exceeds 5% by weight, it may adversely affect on adhesive property, flame retardancy or the like.

Examples of the method for determining the composition and composition rate of the polyester resin include $^1$H-NMR and $^{13}$C-NMR determined by dissolving a polyester resin in a solvent such as heavy chloroform, quantitative analysis by gas chromatography determined after methanolysis of a polyester resin (hereinafter, may be abbreviated as methanolysis-GC method), and the like. In the present invention, in the case where there is a solvent that can dissolve the polyester (A) and is suitable for $^1$H-NMR measurement, the composition and composition ratio shall be determined by $^1$H-NMR. In the case where there is no suitable solvent, and in the case where the composition ratio cannot be specified only by $^1$H-NMR measurement, $^{13}$C-NMR and methanolysis-GC method shall be adopted or concurrently used.

The sealing resin composition of the present invention desirably has a melt viscosity at 220° C. of 5 to 3000 dPa·s, and it can be achieved by properly adjusting the type and the blending ratio of the polyester (A), the epoxy resin (B), the polyolefin resin (C), the phosphoric ester (D), the alkyl benzene resin(E) and the phenol resin (F). For example, increase in the copolymerization ratio of the polyether diols copolymerized with the polyester (A) and lowering of the molecular weight of the polyester (A) tend to act in the direction of lowering the melt viscosity of the resin composition of the present invention, and increase in the molecular weight of the polyester (A) tends to act in the direction of increasing the melt viscosity of the resin composition of the present invention. Here, the melt viscosity at 220° C. is a value measured as below. More specifically, the melt viscosity is a measured value of the viscosity when a sealing resin composition is dried to a water content of 0.1% or less, subsequently, the sealing resin composition warmed and stabilized at 220° C. is passed through a die having a thickness of 10 mm having a hole diameter of 1.0 mm at a pressure of 98 N/cm$^2$, by a flow tester (model CFT-500C) manufactured by SHIMADZU CORPORATION. At a high melt viscosity of 3000 dPa·s or more, high resin cohesive force and durability are obtained, and injection molding is required at high pressure when sealing to a complex shape part, thus the part may be broken. A sealing resin composition having a melt viscosity of 2000 dPa·s or less, and preferably 1000 dPa·s or less, whereby, at a relatively low injection pressure of 0.1 to 100 MPa, a mold part having excellent electric insulation is obtained, and also properties of the electrical and electronic part are not impaired. In addition, from the viewpoint of an operation of injecting a sealing resin composition, the lower melt viscosity at 220° C. is preferable, but considering adhesive property and cohesive force of the resin composition, the lower limit is desirably 5 dPa·s or more, further preferably 10 dPa·s or more, more preferably 30 dPa·s or more, and most preferably 50 dPa·s or more.

Also, in order to mold the polyester (A) without causing thermal degradation as much as possible, rapid melting at 210 to 240° C. is required, thus the upper limit of the melting point of the polyester resin (A) is desirably 210° C. The upper limit is preferably 200° C. and more preferably 190° C. Considering handling properties at ordinary temperature and normal heat resistance, the upper limit is 70° C. or more, preferably 100° C. or more, further preferably 120° C. or more, particularly preferably 140° C. or more, and most preferably 150° C. or more. It is better if the lower limit is higher than the heat resistant temperature required by the corresponding purpose by 5 to 10° C.

In the present invention, the adhesive strength of a sealing resin composition to a specified member can be determined by producing a specimen for measurement, on which 1 plate-like member are adhered with the sealing resin composition by molding, and measuring the T-type peeling strength of the specimen. A method for producing a specimen for measurement and a method for measuring the T-type peeling strength are carried out according to methods in Examples described later.

The sealing resin composition of the present invention is injected into a mold in which an electrical and electronic part is placed, so that a molded product is obtained. More specifically, when a screw-type applicator for hot melt molding is used, the resin composition is heated and melted at about 200 to 280° C., and injected into a mold through an injection nozzle, and after a certain period of cooling time, a molded product may be removed from the mold.

The model of the applicator for hot melt molding is not limited and examples include ST2 manufactured by Nordson, and IMC-18F9, a vertical type extruder manufactured by Imoto Machinery Co., Ltd.

EXAMPLES

The present invention will be described in detail with reference to Examples and Comparative Examples, but the present invention is not limited by the Examples. Measured values described in the Examples and the Comparative Examples are those measured by the following methods.

<Measurement of Water Content>

In a moisture meter "CA-200" (manufactured by Mitsubishi Chemical Analytech, Co., Ltd.), 0.3 mg of a measurement sample (a polyester or a sealing resin composition) was placed in an oven at 200° C. and its water content was measured. The measurement was conducted using AQUAMICRON AX (manufactured by Mitsubishi Chemical Corp.) and AQUAMICRON CXU (manufactured by Mitsubishi Chemical Corp.) as coulometric water content measurement reagents.

<Measurement of Melting Point and Glass Transition Temperature>

5 mg of a measurement sample was put in an aluminum pan, and the aluminum pan was sealed by pressing a lid, and once hold at 250° C. for 5 minutes, then rapidly cooled with liquid nitrogen, thereafter determination was performed at a temperature rising rate of 20° C./min from −150° C. to 250° C., with a differential scan calorimeter "Model DSC220" manufactured by Seiko Instruments Inc. The inflexion point and endothermic peak of the resulting curve were respectively defined as a glass transition temperature and a melting point. In FIG. 1 of the obtained curve, the intersection of the tangent line (1) drawn from the baseline before the inflection point (which appears in the DSC) with the tangent line (2) drawn from the baseline after the inflection point was considered as the glass transition temperature, and the minimum point of the endothermic peak (the X in the chart) was considered as the melting point.

<Adhesive Property Test>

Preparation Method of Adhesive Strength Test Piece

A glass epoxy substrate (1.6 mm thickness) cladded with copper on one side was cut into pieces of 75 mm×20 mm in size, and their surfaces were wiped with acetone to remove oil. Then, three pieces were secured inside of a mold for molding a flat plate (mold inner size: 100 mm width×100 mm length×5 mm depth) in such a way that their glass epoxy surfaces were contacted with a molten resin, and then a 10 mm width cellophane tape was applied to one side of an aluminum plate. Next, a sealing resin composition was injected through a gate provided at the center of the face of 100 mm×100 mm by using a screw type applicator for hot melt molding (vertical type low pressure extruder IMC-18F9, manufactured by Imoto Machinery Co., Ltd.) to carry out molding. The molding conditions were set as follows molding resin temperature 230° C., molding pressure 3.2 MPa, keeping pressure 3.5 MPa, keeping time 20 seconds, discharge rotation: 80% (the maximum discharge 100%). The molded product was released and cut in a manner that the respective cut pieces were stripes with a width of 20 mm having a cellophane tape-bearing part, to give test pieces for an adhesive strength test.

Evaluation of Adhesive Property

The above adhesive test pieces were kept at 23° C. for 3 hours or more and within 100 hours under an atmosphere of a relative humidity of 50%. Then, using Autograph AG-IS (manufactured by SHIMADZU CORPORATION), the aluminum plate was peeled off from the resin at the cellophane tape-applied portion and T-type peeling strength was measured. The pulling speed was 500 mm/min.

Evaluation Criteria:

Extremely excellent: T-type peeling strength is 100N/20 mm or more.

Excellent: T-type peeling strength is less than 100N/20 mm and 50N/20 mm or more.

Good: T-type peeling strength is less than 50N/20 mm and 25N/20 mm or more.

Acceptable: T-type peeling strength is less than 25N/20 mm and 10N/20 mm or more.

Poor: T-type peeling strength is less than 10N/20 mm.

<Melting Property Test>

Method for Evaluating Melt Viscosity of Resin and Sealing Resin Composition

By a flow tester (Model CFT-500C) manufactured by SHIMADZU CORPORATION, a resin or resin composition for sealing dried to a water content of 0.1% or less was filled into a cylinder in the center of a heating body set at 220° C., and after the lapse of 1 minute of filling, a load was added to a sample via a plunger, and the melted sample was extruded from a die (hole diameter: 1.0 mm, thickness: 10 mm) at the bottom of the cylinder, at a pressure of 1 MPa, the distance and time of a descent of the plunger was recorded, to calculate the melt viscosity.

Evaluation Criteria:

Extremely excellent: Melt viscosity of less than 200 dPa·s

Excellent: Melt viscosity of 200 dPa·s or more and less than 300 dPa·s

Good: Melt viscosity of 300 dPa·s or more and less than 1000 dPa·s

Acceptable: Melt viscosity of 1000 dPa·s or more and less than 2000 dPa·s

Poor: Melt viscosity of 2000 dPa·s or more

<Method for Evaluation of Low Pressure Moldability>

Using a mold for flat plate molding and a low pressure molding applicator IMC-18F9 manufactured by Imoto Machinery Co., Ltd. as an applicator for hot melt molding, a flat plate (100 mm×100 mm×2 mm) of a sealing resin composition was molded. The gate position was at the center of the face of 100 mm×100 mm.

Molding conditions: molding resin temperature 230° C., molding pressure 3.2 MPa, keeping pressure 3.5 MPa, keeping time 20 seconds, cooling time 20 seconds, discharge rotation 80%.

Evaluation Criteria:

Excellent: Completely packed and neither burr or sink mark was observed.

Good: Completely packed but burr was slightly observed.

Acceptable: Packed without any short shot, but sink marks existed.

Poor: Short shot was observed.

<Kneadability Test>

Using a twin-screw extruder (PCM-30 manufactured by Ikegai Corp.), sealing resin compositions were made into strands at an extrusion upper limit temperature of the melting point of the base polyester of each composition+30° C. and at a die temperature of the melting point+10° C., and then pelletized. The productivity of pelletization was evaluated according to the following criteria.

Evaluation Criteria:

Good: The pelletization of a composition is possible.

Poor: The pelletization of a composition is impossible.

<Flammability Test>

Flat plates (125 mm×13 mm×1.6) were made by injection molding using a vertical injection molding machine (TH40E manufactured by NISSEI PLASTIC INDUSTRIAL CO., LTD.). The injection molding conditions were as follows: molding resin temperature 220° C., molding pressure 25 MPa, cooling time 25 seconds, and injection speed 20 mm/s. Further, each flat plate of 125 mm×13 mm×1.6 mm was twice contacted with a flame of 2 mm in height for 10 seconds using a Bunsen burner and moved away from the flame, and then the total burning time was measured. This procedure was repeated five times and the average was determined.

Evaluation Criteria:

Excellent: A total of 5 seconds or less

Good: A total of more than 5 seconds and less than 30 seconds

Acceptable: A total of less than 50 seconds and 30 seconds or more

Poor: A total of 50 seconds or more, or burning out of a flat plate.

<Production Example of Polyester (A)>

To a reaction vessel equipped with a stirrer, a thermometer and a condenser for distillation were added 166 parts by weight of terephthalic acid, 180 parts by weight of 1,4-butanediol, 0.25 parts by weight of tetrabutyl titanate, and esterification reaction was carried out at 170 to 220° C. for 2 hours. After completing the esterification reaction, 300 parts by weight of polytetramethylene glycol "PTMG1000" (manufactured by Mitsubishi Chemical Corporation) having a number average molecular weight of 1000 and 0.5 parts by weight of "Irganox (registered trademark) 1330" (manufactured by Nihon Ciba-Geigy K.K.) were added thereto, and heated to 255° C. while slowly reducing a pressure in the system, to reach to 665 Pa at 255° C. for 60 minutes. Then, polycondensation reaction was further carried out at 133 Pa or less for 30 minutes, to obtain polyester (a). The melt viscosity, the melting point and the glass transition temperature of the polyester (a) were shown in Table 1. Polyesters (b) to (d) were synthesized in the same manner as the polyester (a). Compositions and physical property values of each were shown in Table 1.

TABLE 1

| | Polyester | | a | b | c | d |
|---|---|---|---|---|---|---|
| composition mol % | Dicarboxylic acid component | TPA | 100 | | | 100 |
| | | NDC | | 100 | 100 | |
| | Diol component | BD | 72 | 60 | 58 | 60 |
| | | PTMG1000 | 28 | 40 | | |
| | | PTMG2000 | | | 42 | |
| | | Polycaprolactone | | | | 40 |
| Properties | Melt viscosity dPa · s | | 250 | 400 | 400 | 1500 |
| | Melting point ° C. | | 165 | 185 | 159 | 170 |
| | Glass transition temperature ° C. | | −65 | −70 | −75 | −10 |

Abbreviations in Table are as follows.

TPA: terephthalic acid, NDC: naphthalene dicarboxylic acid, BD: 1,4-butanediol, PTMG1000: polytetramethylene ether glycol (the number average molecular weight is 1000), PTMG2000: polytetramethylene ether glycol (the number average molecular weight is 2000).

EXAMPLE 1

A resin composition 1 for sealing electrical and electronic parts was obtained by homogeneously mixing 100 parts by weight of polyester (b), 15 parts by weight of phosphorus-containing epoxy resin (a), 30 parts by weight of polyolefin resin (a) and 10 parts by weight of phosphoric ester (b) and then melting and kneading the mixture at a die temperature of 190° C. to 220° C. using a twin-screw extruder. According to the methods as stated elsewhere herein, the melting property, initial adhesive property, adhesive property with time, flammability test, and low pressure moldability of the resin composition 1 for sealing electrical and electronic parts were evaluated. <Melting Property Test> showed that the composition had good melting property (402 dPa·s). <Low Pressure Moldability Test> showed that a good molded product having no burr or sink mark was obtained. In <Adhesive Strength Test>, the adhesive strength was 26 N/20 mm and good adhesive property was attained. Further, in <Flammability Test>, the total burning time after contacting with a flame was 9 seconds, showing good flame retardancy. The evaluation results are shown in Table 2.

EXAMPLES 2 to 22, COMPARATIVE EXAMPLES 1 to 8, REFERENCE EXAMPLES 1 to 5

Resin compositions for sealing electrical and electronic parts 2 to 35 were produced in the same manner as in Example 1 except that the formulations were modified as shown in Tables 2 to 5, and evaluated. The evaluation results are shown in Tables 2 to 5.

The phosphorus-containing epoxy resin, the phosphorus-free epoxy resin, polyolefin resin, alkyl benzene resin and phenol resin used in Tables 2 to 5 are as described bellow.

Phosphorus-containing epoxy resin (a): 9,10-dihydro-9-oxa-10-phosphaphenanthrene-10 oxide (manufactured by Sanko Co., Ltd., HCA (registered trademark)): polyethylene glycol glycidyl ether=82:18 (weight ratio)

Phosphorus-containing epoxy resin (b): 9,10-dihydro-10-(2,5-dihydroxyphenyl)-9-oxa-10-phosphaphenanthrene-10 oxide (manufactured by Sanko Co., Ltd., HCA-HQ (registered trademark)): polyethylene glycol glycidyl ether=43:57 (weight ratio)

Phosphorus-free epoxy resin (a): JER1007, manufactured by Japan Epoxy Resin Co., Ltd., epoxy resin, number average molecular weight 2000

Phosphorus-free epoxy resin (b): YP-505, manufactured by Nippon Steel Chemical Co., Ltd., epoxy resin, number average molecular weight 23000

Polyolefin resin (a): EXCELLEN (registered trademark) VL EUL731, manufactured by Sumitomo Chemical Co., Ltd., ethylene-α-olefin copolymer, density 0.90, MFR 10 g/10 min Polyolefin resin (b): Admer (registered trademark) SF-600, manufactured by Mitsui Chemicals Inc., polyolefin for adhesive, density 0.88, MFR 3.3 g/10 min Phosphoric ester (a): REOFS (registered trademark) 35, manufactured by Ajinomoto Fine-Techno Co., Inc., isopropylated triaryl phosphate: triphenylphosphate=59:41 (central value) blend Phosphoric ester (b): REOFS (registered trademark) 65, manufactured by Ajinomoto Fine-Techno Co., Inc., isopropylated triaryl phosphate: triphenylphosphate=76:24 (central value) blend Phosphoric ester (c): REOFS (registered trademark) 110, manufactured by Ajinomoto Fine-Techno Co., Inc., isopropylated triaryl phosphate: triphenylphosphate=92.4:7.6 (central value) blend Alkyl benzene resin (a): Nikanol (registered trademark) HP-150, manufactured by Fudow Co., Ltd., phenol-modified xylene resin, hydroxyl value 3035 equivalent/$10^6$ g Alkyl benzene resin (b): Nikanol (registered trademark) HP-100, manufactured by Fudow Co., Ltd., phenol-modified xylene resin, hydroxyl value 2500 equivalent/$10^6$ g Phenol resin (a): CKM2400, manufactured by Showa Highpolymer Co., Ltd., novolac type phenol resin, hydroxyl value 9000 equivalent/$10^6$ g Phenol resin (b): EP4020, manufactured by Asahi Organic Chemicals Co., Ltd., cresol novolac type phenol resin, hydroxyl value 9250 equivalent/$10^6$ g

TABLE 2

| Resin composition | | | Example 1 Comp. 1 | Example 2 Comp. 2 | Example 3 Comp. 3 | Example 4 Comp. 4 | Example 5 Comp. 5 | Example 6 Comp. 6 | Example 7 Comp. 7 | Example 8 Comp. 8 | Example 9 Comp. 9 | Example 10 Comp. 10 | Example 11 Comp. 11 |
|---|---|---|---|---|---|---|---|---|---|---|---|---|---|
| Compound ratio (parts by weight) | Polyester (A) | Polyester (a) | | | | | | | | | 100 | 100 | |
| | | Polyester (b) | 100 | 100 | 100 | 100 | 100 | 100 | | | | | |
| | | Polyester (c) | | | | | | | 100 | 100 | | | |
| | | Polyester (d) | | | | | | | | | | | 100 |
| | Phosphorus-containing epoxy resin (B1) | Phosphorus-containing epoxy resin (a) | 15 | 30 | 45 | | 15 | 15 | 45 | | | 15 | 15 |
| | | Phosphorus-containing epoxy resin (b) | | | | 15 | | | | 15 | 45 | | |
| | Phosphorus-free epoxy resin (B2) | Phosphorus-free epoxy resin (a) | | | | | 5 | | | 5 | | 5 | |
| | | Phosphorus-free epoxy resin (b) | | | | | | 15 | | | | 5 | |
| | Polyolefin resin (C) | Polyolefin resin (a) | 30 | 15 | 15 | 15 | 15 | 15 | 15 | | 15 | 15 | 30 |
| | | Polyolefin resin (b) | | | | | | | | 15 | | | |
| | Phosphoric ester (D) | Phosphoric ester (a) | | 10 | | | | | 10 | | | | |
| | | Phosphoric ester (b) | 10 | | 10 | 10 | 10 | 10 | | 10 | 10 | | 10 |
| | | Phosphoric ester (c) | | | | | | | | | | 10 | |
| Properties | Low pressure moldability test | | Good | Good | Good | Good | Good | Good | Good | Good | Good | Good | Good |
| | Melting property test | | Good | Excellent | Excellent | Excellent | Excellent | Good | Excellent | Excellent | Excellent | Excellent | Good |
| | Flammability test | | Good | Excellent | Excellent | Excellent | Excellent | Excellent | Excellent | Excellent | Excellent | Excellent | Good |
| | Adhesive strength test | | Good | Good | Good | Good | Excellent | Excellent | Good | Excellent | Good | Excellent | Excellent |

TABLE 3

| Resin composition | | | Comparative Example 1 Comp. 12 | Comparative Example 2 Comp. 13 | Comparative Example 3 Comp. 14 | Comparative Example 4 Comp. 15 | Reference Example 1 Comp. 16 |
|---|---|---|---|---|---|---|---|
| Compound ratio (parts by weight) | Polyester (A) | Polyester (a) | | | | 100 | |
| | | Polyester (b) | 100 | 100 | 100 | | |
| | | Polyester (c) | | | | | 100 |
| | Phosphorus-containing epoxy resin (B1) | Phosphorus-containing epoxy resin (a) | 15 | | 15 | | |
| | | Phosphorus-containing epoxy resin (b) | | | | | |
| | Phosphorus-free epoxy resin (B2) | Phosphorus-free epoxy resin (a) | | | | | 15 |
| | | Phosphorus-free epoxy resin (b) | | | | | |
| | Polyolefin resin (C) | Polyolefin resin (a) | | 30 | 15 | 15 | 30 |
| | | Polyolefin resin (b) | | | | | |
| | Phosphoric ester (D) | Phosphoric ester (a) | | | | | |
| | | Phosphoric ester (b) | 10 | 10 | | 10 | 10 |
| | | Phosphoric ester (c) | | | | | |
| Properties | Low pressure moldability test | | Good | Good | Good | Good | Good |
| | Melting property test | | Good | Good | Good | Excellent | Good |
| | Flammability test | | Good | Acceptable | Poor | Poor | Poor |
| | Adhesive strength test | | Acceptable | Poor | Good | Poor | Good |

TABLE 4

| Resin composition | | | Example 12 Comp. 17 | Example 13 Comp. 18 | Example 14 Comp. 19 | Example 15 Comp. 20 | Example 16 Comp. 21 | Example 17 Comp. 22 |
|---|---|---|---|---|---|---|---|---|
| Compound ratio (parts by weight) | Polyester (A) | Polyester (a) | 100 | 100 | 100 | | | |
| | | Polyester (b) | | | | 100 | 100 | 100 |
| | | Polyester (c) | | | | | | |
| | | Polyester (d) | | | | | | |
| | Phosphorus-free epoxy resin (B2) | Phosphorus-free epoxy resin (a) | | | 5 | 10 | | 5 |
| | | Phosphorus-free epoxy resin (b) | 5 | 10 | | | 5 | |
| | Polyolefin resin (C) | Polyolefin resin (a) | 15 | 45 | | 45 | | 15 |
| | | Polyolefin resin (b) | | | 30 | | 30 | |
| | Phosphoric ester (D) | Phosphoric ester (a) | | 20 | | 20 | 20 | |
| | | Phosphoric ester (b) | 10 | | 20 | | | 10 |
| | Alkyl benzene resin (E) | Alkyl benzene resin (a) | 15 | 40 | | | 40 | 15 |
| | | Alkyl benzene resin (b) | | | 40 | 40 | | |
| | Phenol resin (F) | Phenol resin (a) | | | | | | |
| | | Phenol resin (b) | | | | | | |

TABLE 4-continued

| Properties | Melting property test | Extremely excellent | Good | Excellent | Good | Excellent | Extremely excellent |
|---|---|---|---|---|---|---|---|
| | Kneadability Test | Good | Good | Good | Good | Good | Good |
| | Adhesive strength test | Extremely excellent | Extremely excellent | Extremely excellent | Extremely excellent | Extremely excellent | Extremely excellent |
| | Flammability test | Good | Good | Good | Good | Good | Good |

| | | | Examples/Comparative Examples | | | | |
|---|---|---|---|---|---|---|---|
| | Resin composition | | Example 18 Comp. 23 | Example 19 Comp. 24 | Example 20 Comp. 25 | Example 21 Comp. 26 | Example 22 Comp. 27 |
| Compound ratio (parts by weight) | Polyester (A) | Polyester (a) | | | | | |
| | | Polyester (b) | | | | | |
| | | Polyester (c) | 100 | 100 | 100 | 100 | |
| | | Polyester (d) | | | | | 100 |
| | Phosphorus-free epoxy resin (B2) | Phosphorus-free epoxy resin (a) | | 5 | | 5 | |
| | | Phosphorus-free epoxy resin (b) | 10 | | 10 | | 5 |
| | Polyolefin resin (C) | Polyolefin resin (a) | | 15 | | 15 | 15 |
| | | Polyolefin resin (b) | 45 | | 45 | | |
| | Phosphoric ester (D) | Phosphoric ester (a) | 20 | | 20 | | |
| | | Phosphoric ester (b) | | 10 | | 10 | 10 |
| | Alkyl benzene resin (E) | Alkyl benzene resin (a) | | 15 | 10 | | 15 |
| | | Alkyl benzene resin (b) | 40 | | | | |
| | Phenol resin (F) | Phenol resin (a) | | | | 15 | |
| | | Phenol resin (b) | | | 30 | | |
| Properties | Melting property test | | Good | Extremely excellent | Good | Extremely excellent | Good |
| | Kneadability Test | | Good | Good | Good | Good | Good |
| | Adhesive strength test | | Excellent | Excellent | Excellent | Excellent | Extremely excellent |
| | Flammability test | | Good | Good | Good | Good | Good |

TABLE 5

| | | | Examples/Comparative Exampkes | | | | | | | |
|---|---|---|---|---|---|---|---|---|---|---|
| | Resin composition | | Comparative Example 5 Comp. 28 | Comparative Example 6 Comp. 29 | Comparative Example 7 Comp. 30 | Comparative Example 8 Comp. 31 | Reference Example 2 Comp. 32 | Reference Example 3 Comp. 33 | Reference Example 4 Comp. 34 | Reference Example 5 Comp. 35 |
| Compound ratio (parts by weight) | Polyester (A) | Polyester (a) | 100 | 100 | | | 100 | 100 | | |
| | | Polyester (b) | | | 100 | | | | 100 | |
| | | Polyester (c) | | | | 100 | | | | 100 |
| | Phosphorus-free epoxy resin (B2) | Phosphorus-free epoxy resin (a) | 10 | | | | 10 | | 10 | |
| | | Phosphorus-free epoxy resin (b) | | | 10 | | | 10 | | 30 |
| | Polyolefin resin (C) | Polyolefin resin (a) | 30 | | | 15 | 15 | | 50 | 15 |
| | | Polyolefin resin (b) | | 15 | | | | 15 | | |
| | Phosphoric ester (D) | Phosphoric ester (a) | | | 5 | 5 | 5 | | 5 | |
| | | Phosphoric ester (b) | | 15 | | | | 5 | | 35 |

TABLE 5-continued

| Resin composition | | Comparative Example 5 Comp. 28 | Comparative Example 6 Comp. 29 | Comparative Example 7 Comp. 30 | Comparative Example 8 Comp. 31 | Reference Example 2 Comp. 32 | Reference Example 3 Comp. 33 | Reference Example 4 Comp. 34 | Reference Example 5 Comp. 35 |
|---|---|---|---|---|---|---|---|---|---|
| Alkyl benzene resin (E) | Alkyl benzene resin (a) | | | | | | | 15 | 15 |
| | Alkyl benzene resin (b) | 30 | 15 | | | | 50 | | |
| Phenol resin (F) | Phenol resin (a) | | | 15 | | | | | |
| | Phenol resin (b) | | | | 15 | | | | |
| Properties | Melting property test | Good | Extremely excellent | Excellent | Excellent | Excellent | Extremely excellent | Poor | Extremely excellent |
| | Kneadability Test | Good | Good | Good | Good | Good | Poor | Good | Poor |
| | Adhesive strength test | Good | Poor | Poor | Poor | Poor | Excellent | Poor | Poor |
| | Flammability test | Poor | Good | Good | Good | Good | Good | Good | Good |

With respect to Comparative Example 1, <Melting Property Test> showed that the composition had good melting property (353 dPa·s), and <Low Pressure Moldability Test> showed that good molded products having no burr or sink mark were obtained. Further, in <Flammability Test>, the total burning time after contacting with a flame was 6 seconds, showing good flame retardancy. However, in <Adhesive Strength Test>, the adhesive strength was 15 N/20 mm, showing poor adhesive property.

Regarding Comparative Example 2, <Melting Property Test> showed that the composition had good melting property (447 dPa·s) and <Low Pressure Moldability Test> showed that good molded products having no burr or sink mark were obtained. However, in <Flammability Test>, the total burning time after contacting with a flame was 38 seconds, showing high flammability and poor flame retardancy. In <Adhesive Strength Test>, the adhesive strength was 5 N/20 mm, showing very poor adhesive property.

INDUSTRIAL APPLICABILITY

The resin composition of the present invention is low in melt viscosity when sealing an electronic and electronic substrate, excellent in adhesive strength to a glass epoxy substrate, and excellent in flame retardancy, and therefore useful as a resin composition for sealing electrical and electronic parts. The sealed electrical and electronic parts of the present invention are also excellent among others in flame retardancy and adhesive property, and therefore inhibit firing and flame propagation which may be caused by the electrical leakage and overcurrent of electrical and electronic parts, and are very useful. The sealed electrical and electronic parts of the present invention are useful as molded products including, for example, connectors, harness or electronic parts, switches having printed boards, and sensors which are used for various fields such as automobiles, communications, computers, and home electric appliances.

The invention claimed is:

1. A resin composition for sealing electrical and electronic parts, comprising:
   a copolymerized polyester (A) containing a polyalkylene glycol component and/or a polylactone component;
   an epoxy resin (B);
   a polyolefin resin (C); and
   a phosphoric ester (D),
   wherein the phosphoric ester (D) comprises an isopropylated triaryl phosphate of formula (4) and a triphenyl-phosphate of formula (5) in a ratio of 99/1 to 1/99 in % by weight

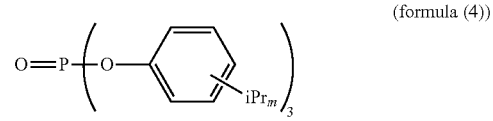

(formula (4))

wherein m is an integer of 1 to 5, and

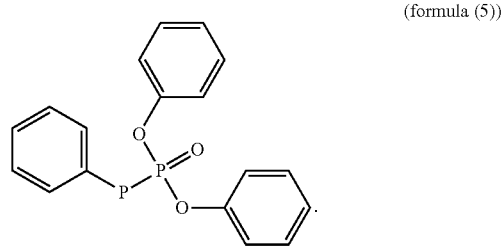

(formula (5))

2. The resin composition for sealing electrical and electronic parts according to claim 1, wherein the polyester (A) is a copolymer which contains the polyalkylene glycol component and/or the polylactone component in a total amount of 20 to 80% by weight.

3. The resin composition for sealing electrical and electronic parts according to claim 1, wherein the epoxy resin (B) is a phosphorus-containing epoxy resin (B1), a phosphorus-free epoxy resin (B2), or a mixture thereof.

4. The resin composition for sealing electrical and electronic parts according to claim 3, wherein the phosphorus-containing epoxy resin (B1) is a mixture of a compound of formula (1) and a compound of formula (2) and/or a compound of formula (3):

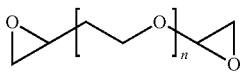
(formula (1))

wherein n is an integer of 1 to 50,

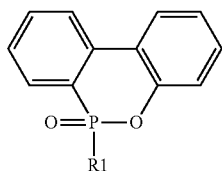
(formula (2))

wherein R1 is hydrogen, a linear or branched alkyl group having 1 to 6 carbon atoms, or a linear or branched hydroxyalkyl group having 1 to 6 carbon atoms and having up to 3 hydroxyl groups at each end, and

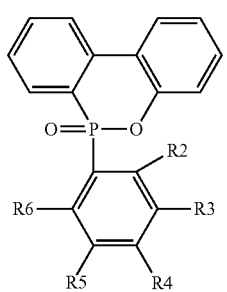
(formula (3))

wherein R2 to R6 are each independently hydrogen, a hydroxyl group, a linear or branched alkyl group having 1 to 6 carbon atoms, or a linear or branched hydroxyalkyl group having 1 to 6 carbon atoms and having up to 3 hydroxyl groups at each end.

5. The resin composition for sealing electrical and electronic parts according to claim 4, wherein a ratio of the compound of formula (1) to a total of the compound of formula (2) and/or the compound of formula (3) is 99.9/0.1 to 0.1/99.9 in % by weight.

6. The resin composition for sealing electrical and electronic parts according to claim 1, which comprises 0.1 to 50 parts by weight of the epoxy resin (B), 0.5 to 80 parts by weight of the polyolefin resin (C), and 0.1 to 20 parts by weight of the phosphoric ester (D), based on 100 parts by weight of the polyester (A).

7. The resin composition for sealing electrical and electronic parts according to claim 1, further comprising an alkyl benzene resin (E) and/or a phenol resin (F).

8. The resin composition for sealing electronic and electrical parts according to claim 7, wherein the alkyl benzene resin (E) is an alkylphenol-modified alkyl benzene resin and has a hydroxyl value of 100 equivalents/$10^6$ g or more.

9. The resin composition for sealing electronic and electrical parts according to claim 7, wherein the phenol resin (F) is a novolac type phenol resin and has a hydroxyl value of 100 equivalents/$10^6$ g or more.

10. The resin composition for sealing electronic and electrical parts according to claim 7, which comprises a total of 0.1 to 45 parts by weight of the alkyl benzene resin (E) and/or the phenol resin (F), based on 100 parts by weight of the polyester (A).

11. The resin composition for sealing electrical and electronic parts according to claim 1, which has an initial T-type peeling strength to a glass epoxy substrate of 25 N/20 mm or more.

12. A method for producing sealed electrical and electronic parts, comprising:
heating and kneading the resin composition according to claim 1; and
thereafter injecting the resin composition into a mold including an inserted electrical and electronic part at a resin composition temperature of 130° C. or more and 260° C. or less and at a resin composition pressure of 0.1 MPa or more and 20 MPa or less.

13. A sealed electrical and electronic part sealed with the resin composition according to claim 1.

* * * * *